United States Patent
Won et al.

(10) Patent No.: US 9,634,341 B2
(45) Date of Patent: Apr. 25, 2017

(54) APPARATUS AND METHOD FOR DIAGNOSING FUEL CELL

(71) Applicant: HYUNDAI MOTOR COMPANY, Seoul (KR)

(72) Inventors: Sang Bok Won, Seoul (KR); Kwi Seong Jeong, Yongin-si (KR)

(73) Assignee: Hyundai Motor Company, Seoul (KR)

( * ) Notice: Subject to any disclaimer, the term of this patent is extended or adjusted under 35 U.S.C. 154(b) by 71 days.

(21) Appl. No.: 14/686,599

(22) Filed: Apr. 14, 2015

(65) Prior Publication Data
US 2016/0149240 A1   May 26, 2016

(30) Foreign Application Priority Data

Nov. 25, 2014 (KR) ........................ 10-2014-0165612

(51) Int. Cl.
*H01M 8/04537* (2016.01)
*G01R 31/40* (2014.01)

(52) U.S. Cl.
CPC ........ *H01M 8/04641* (2013.01); *G01R 31/40* (2013.01)

(58) Field of Classification Search
CPC combination set(s) only.
See application file for complete search history.

(56) References Cited

U.S. PATENT DOCUMENTS

| 8,635,037 B2 | 1/2014 | Quet |
| 2004/0091759 A1* | 5/2004 | Harrington ........ G01R 31/3662 429/431 |
| 2009/0276172 A1 | 11/2009 | Nishi |
| 2013/0030737 A1 | 1/2013 | Okada |
| 2015/0084639 A1 | 3/2015 | Joe |
| 2016/0006061 A1* | 1/2016 | Choi ................... H01M 8/0494 307/20 |

FOREIGN PATENT DOCUMENTS

| JP | 2008-058278 A | 3/2008 |
| KR | 10-2009-0076679 A | 7/2009 |
| KR | 10-2011-0027037 A | 3/2011 |
| KR | 10-2014-0071929 A | 6/2014 |

\* cited by examiner

*Primary Examiner* — Clayton E Laballe
*Assistant Examiner* — Jas Sanghera
(74) *Attorney, Agent, or Firm* — McDermott Will & Emery LLP

(57) ABSTRACT

An apparatus and method for diagnosing a fuel cell diagnoses a state of a fuel cell by estimating a fuel-cell equivalent circuit. The apparatus for diagnosing a fuel cell includes: an impedance measurement unit configured to measure impedance of a fuel cell within a predetermined frequency range; an equivalent circuit model unit configured to derive each parameter value by estimating a predetermined fuel-cell equivalent circuit model in response to the impedance received from the impedance measurement unit; and a fuel-cell-state diagnosis unit configured to diagnose a state of the fuel cell by detecting a variation of the parameter value derived from the equivalent circuit model unit.

12 Claims, 7 Drawing Sheets

APPARATUS AND METHOD FOR DIAGNOSING FUEL CELL

CROSS-REFERENCE TO RELATED APPLICATION

This application claims priority to Korean patent application No. 10-2014-0165612 filed on Nov. 25, 2014 in the Korean Intellectual Property Office, the disclosure of which is hereby incorporated in its entirety by reference.

BACKGROUND OF THE INVENTION

The present disclosure relates to an apparatus and method for diagnosing a fuel cell, and more particularly to a technology for diagnosing a state of a fuel cell by estimating a fuel-cell equivalent circuit.

A fuel cell stack is an energy conversion system that generates electrochemical reaction by applying fuel gas and oxygen gas to a membrane electrode assembly (MEA) so that chemical energy is converted into electric energy.

A solid polymer electrolyte fuel cell stack designed to use a solid polymer film as an electrolyte is inexpensive and has a compact structure, and has high output density, so that the solid polymer electrolyte fuel cell has been widely used as a vehicle-embedded power source.

Throughput and lifetime a Polymer Electrolyte Membrane Fuel Cell (PEMFC) (hereinafter referred to as a fuel cell) are affected by operation conditions of the fuel cell. Operation conditions of the fuel cell may include current, temperature, amount of reactant, pressure of reactant, amount of cooling material, the amount of moisture content, etc.

In order to optimally control the operation conditions of the above-mentioned fuel cell on the basis of a current state of the fuel cell, many developers and companies are conducting intensive research into various methods for diagnosing the fuel cell state.

Representative examples for diagnosing the above fuel-cell state may include AC (Alternating Current) impedance measurement, current-voltage curve measurement, catalytic-area measurement, etc. so as to diagnose a state of the above fuel cell.

In this case, the AC impedance measurement generally inputs an AC signal (voltage or current) of frequency f of 0.1~1000 Hz to a fuel cell, measures a response in each region, and thus calculates impedance. The impedance measurement has been widely used to recognize an internal state of the fuel cell.

That is, an alternating current is applied to the fuel cell, and an AC voltage of the fuel cell is measured with respect to the alternating current. Impedance Z(f) of the fuel cell is calculated. In this case, the impedance of the fuel cell may be represented by "Z(f)=Vac(f)/Iac(f)". The internal state of the fuel cell is recognized through the calculated fuel-cell impedance Z(f).

The following effects can be obtained by measuring the impedance of the fuel cell.

For example, impedance of the alternating current of 300 Hz is measured so that the amount of moisture contained in the fuel cell can be measured. That is, the moisture content of the fuel cell is inversely proportional to output impedance.

Impedance of the 20 Hz alternating current is measured so that an internal state of the fuel cell is measured. In addition, impedance of the 4 Hz alternating current is measured so that a state of the gas supply to the fuel cell is measured. If the gas supply to the fuel cell is not facilitated, impedance of the fuel cell is increased and the output and operation stability of the fuel cell are deteriorated.

However, the above-mentioned method for diagnosing the fuel cell state on the basis of an impedance value measured by the fuel cell has difficulty in recognizing a correct state of the fuel cell. That is, the conventional fuel-cell-state measurement method recognizes the internal moisture state of the fuel cell using an impedance value of one frequency (e.g., 300 Hz), uses data of all the obtained frequency ranges, and measures impedance of one fixed fuel-cell equivalent circuit model.

Since the method for recognizing an internal state of the fuel cell using impedance of one frequency is easily affected by measurement error and noise, it has difficulty in reliably diagnosing the fuel cell state.

Assuming that the fuel cell state is diagnosed through the equivalent circuit model, the equivalent circuit model has the same degree of freedom as in the number of parameters, so that a complicated model requires a huge number of calculations. Therefore, a super-high-capacity memory and a higher calculation capability are needed such that production costs and power consumption are unavoidably increased.

The method for deriving the fuel-cell equivalent circuit parameter using Complex Non-linear Least Squares (CNLS) does not always obtain an optimum value, and may derive a local solution instead of a global solution as necessary.

However, there is a high possibility of deriving parameter values quite different from the actual internal state of the fuel cell. The above-mentioned local solution may have a higher possibility of deriving parameter values as the given model has higher complexity.

BRIEF SUMMARY OF THE INVENTION

Various embodiments of the present invention are directed to providing an apparatus and method for diagnosing a fuel cell that substantially obviates one or more problems due to limitations and disadvantages of the related art.

An embodiment of the present invention relates to a technology for measuring impedance of a fuel cell, estimating the equivalent circuit model of the fuel cell, and correctly determining the internal state of the fuel cell.

The embodiment of the present invention relates to a technology for calculating Complex Non-linear Least Squares (CNLS) using only data of high frequencies for each parameter, and simplifying other parameters, resulting in reduction of local solution.

The embodiment of the present invention relates to a technology for selectively using impedance data measured in response to a desired parameter to be derived, and reducing the degree of freedom by simplifying the fuel-cell equivalent circuit model, so that the number of calculations and memory capacity required for diagnosing the fuel cell state can be reduced.

In accordance with an aspect of the embodiment, an apparatus for diagnosing a fuel cell includes: an impedance measurement unit configured to measure impedance of a fuel cell within a predetermined frequency range; an equivalent circuit model unit configured to derive each parameter value by estimating a predetermined fuel-cell equivalent circuit model in response to the impedance received from the impedance measurement unit; and a fuel-cell-state diagnosis unit configured to diagnose a state of the fuel cell by detecting a variation of the parameter value derived from the equivalent circuit model unit.

In accordance with another aspect of the embodiment, a method for diagnosing a fuel cell includes: measuring impedance of a fuel cell within a predetermined frequency range; deriving each parameter value by estimating a predetermined fuel-cell equivalent circuit model in response to the measured impedance; and diagnosing a state of the fuel cell by detecting a variation of the derived parameter value.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
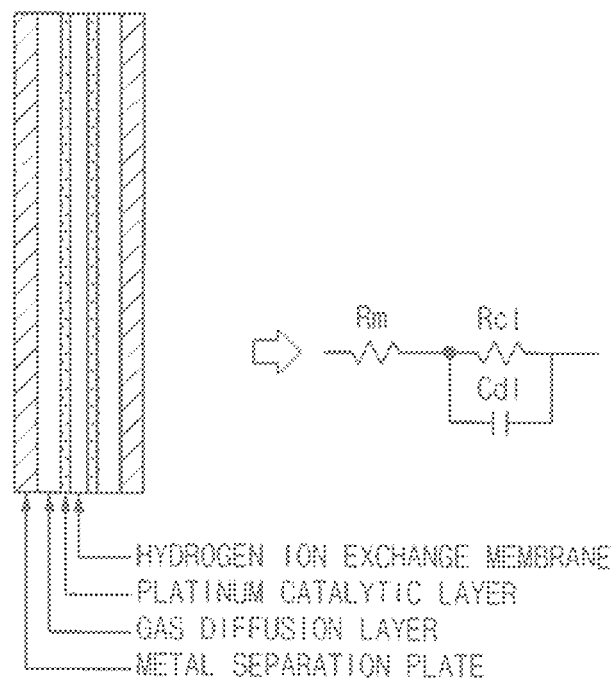
FIG. 1 shows a structure of a fuel cell of a fuel-cell diagnosis apparatus and an equivalent circuit of the fuel cell according to an embodiment of the present invention.

FIG. 1 is a structure of a fuel cell of a fuel-cell diagnosis apparatus and an equivalent circuit of the fuel cell according to an embodiment of the present invention.

The fuel cell may include a hydrogen ion exchange membrane, a platinum catalytic layer, a gas diffusion layer, and a metal separation plate.

The fuel cell equivalent circuit model may include an active resistor ($R_{ct}$) and a capacitor ($C_{dl}$) having a charge double layer. Here, the active resistor ($R_{ct}$) and the capacitor ($C_{dl}$) are coupled in parallel to each other. An ohmic resistor ($R_m$) is coupled in series to a common connection node between the active resistor ($R_{ct}$) and the capacitor ($C_{dl}$).

In this case, the ohmic resistor ($R_m$) may correspond to electric resistance of the electrolyte layer, and the active resistor ($R_{ct}$) may correspond to the resultant value obtained when the active overvoltage and the diffusion overvoltage are converted into a resistance value.

The capacitor ($C_{dl}$) may correspond to an electric double-layer capacity formed not only at an interface between an anode electrode and an electrolyte layer of the fuel cell, but also an interface between a cathode electrode and an electrolyte layer of the fuel cell. If a sinusoidal current having a predetermined frequency is applied to this equivalent circuit, a voltage response to variation of a current becomes slower.

Figure 2:
FIG. 2 is a block diagram illustrating a fuel cell diagnosis apparatus according to an embodiment of the present invention.

FIG. 2 is a block diagram illustrating a fuel cell diagnosis apparatus according to an embodiment of the present invention.

Referring to FIG. 2 the fuel cell diagnosis apparatus may include an impedance measurement unit 100, an equivalent circuit model unit 200, and a fuel-cell-state diagnosis unit 300.

The impedance measurement unit 100 may measure impedance of the fuel cell within a specific frequency range, and output the measured impedance to the equivalent circuit model unit 200.

The equivalent circuit model unit 200 may calculate a parameter value of the fuel cell equivalent circuit on the basis of not only impedance data measured by the impedance measurement unit 100 but also the equivalent circuit model. In this case, the equivalent circuit model unit 200 may calculate respective parameters of the equivalent circuit model using CNLS (Complex Non-linear Least Squares).

In addition, the fuel cell state diagnosis unit 300 may diagnose the fuel cell state in response to the parameter value derived by the equivalent circuit model unit 200.

A general method for diagnosing the fuel cell state may use the measured impedance value without change.

For example, if the impedance Z(300 Hz) is equal to or less than 0.1 mΩ, it is determined that the internal moisture state of the fuel cell is an appropriate or excess state. If the impedance Z(300 Hz) is set to about 0.2 mΩ, it is determined that the internal moisture state of the fuel cell is insufficient. If the impedance Z(300 Hz) is equal to or higher than 0.3 mΩ, it is determined that the internal moisture content of the fuel cell is very insufficient.

If the impedance Z(4 Hz) is equal to or less than 0.5 mΩ, this means that reaction gas is smoothly supplied to the fuel cell. In addition, if impedance Z(4 Hz) is set to about 0.8 mΩ, this means that the there is an insufficient amount of reaction gas in the fuel cell. In addition, if the impedance Z(4 Hz) is equal to or higher than 1.2 mΩ, this means that the fuel-cell reaction gas is very lower in amount.

In this case, a general method for diagnosing the fuel cell state includes measuring impedance of a specific frequency (e.g., 300 Hz), and recognizing the internal moisture content of the fuel cell on the basis of the measured impedance. The internal state of the fuel cell is absolutely determined by impedance of the 300 Hz frequency, so that it is impossible to correctly measure the fuel cell state.

Therefore, the embodiment can derive the equivalent circuit parameter values of the fuel cell using the CNLS.

Figure 3:
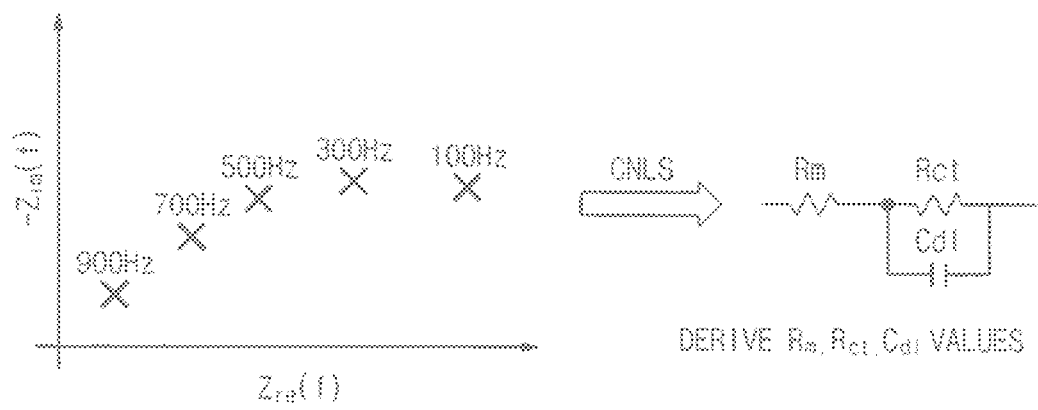
FIG. 3 is a conceptual diagram illustrating a method for deriving a fuel cell parameter from the equivalent circuit model unit shown in FIG. 1.

FIG. 3 is a conceptual diagram illustrating a method for deriving a fuel cell parameter from the equivalent circuit model unit 200 shown in FIG. 1.

CNLS may derive data obtained when the impedance measurement unit 100 measures impedance corresponding to each frequency, and may also derive individual parameter values on the basis of a predetermined fuel cell equivalent circuit (shown in the right circuit diagram of FIG. 3).

That is, three values ($R_m$, $R_{ct}$, $C_{dl}$) are derived from the equivalent circuit shown in FIG. 3. Here, $R_m$ is an ohmic resistor, $R_{ct}$ is an active resistor, and $C_{dl}$ is a capacitor caused by a charge double layer.

The fuel cell equivalent circuit model is a nonlinear model in which individual parameters are combined with each other, and the impedance of the fuel cell equivalent circuit has a complex number. Therefore, the equivalent circuit model unit 200 may properly derive parameters of the fuel cell equivalent circuit using the CNLS.

CNLS is a method for deriving a parameter value of the model by fitting a complex number to data. The method for deriving the parameter value is represented by the following equation 1, in which $Z(f)=Z_{re}(f)+jZ_{im}(f)$.

$$\text{Model}: Z(f) = R_m + \frac{R_{ct}}{1 + j \cdot 2\pi \cdot f \cdot R_{ct} \cdot C_{dl}} \quad \text{[Equation 1]}$$

Figure 4:
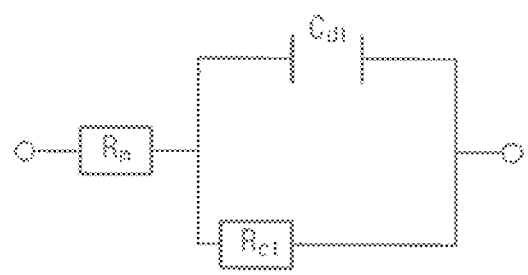
FIGS. 4 to 6 illustrate equivalent circuit models for use in the equivalent circuit model unit.
Figure 5:
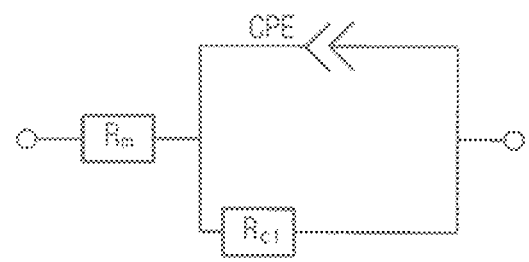
Figure 6:
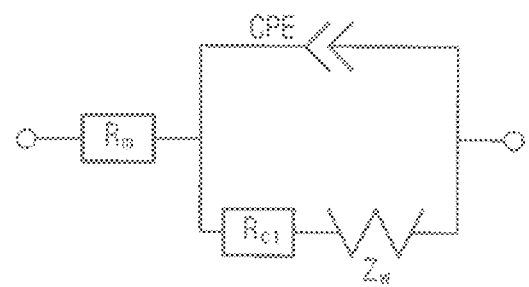

FIGS. 4 to 6 illustrate equivalent circuit models for use in the equivalent circuit model unit 200.

In case of deriving parameters of the fuel cell equivalent circuit, the equivalent circuit model unit 200 is designed to use the most appropriate measurement data for each parameter and the fuel cell equivalent circuit model appropriate for each parameter.

That is, the impedance measurement unit 100 may measure impedance of the fuel cell within a specific frequency range. In this case, the impedance measurement unit may measure impedance at a frequency range of 0.1~1 kHz.

The equivalent circuit model unit 200 may derive a parameter value associated with the ohmic resistor ($R_m$) of the equivalent circuit. For example, measurement data may use the frequency range of 200~1 kHz, and may use the equivalent circuit model shown in FIG. 4.

Thereafter, the equivalent circuit model unit 200 may derive parameter values for the active resistor ($R_{ct}$) and the capacitor ($C_{PE}$). For example, the measurement data may use the frequency range of 20~200 Hz, and may use the equivalent circuit model shown in FIG. 5. In this case, the parameter value for the ohmic resistor ($R_m$) may be fixed to a value obtained from the previous step.

Subsequently, the equivalent circuit model unit 200 may derive the parameter value for the resistor ($Z_w$) of the equivalent circuit. For example, the measurement data may use the frequency range of 0.1~20 Hz, and may use the equivalent circuit model shown in FIG. 6. In this case, the parameter values for the ohmic resistor ($R_m$), the active resistor ($R_{ct}$), and the capacitor ($C_{PE}$) may be fixed to values obtained from the previous step.

As described above, the fuel-cell equivalent circuit parameter has the following physical meaning.

The ohmic resistor ($R_m$) may indicate the fuel cell electrolyte membrane resistance changing in response to internal moisture content of the fuel cell. The capacitor ($C_{dl}$) may reflect interfacial characteristics between the fuel cell membrane and the catalyst, and may be used to simplify the capacitance ($C_{PE}$).

In addition, the active resistor ($R_{ct}$) may denote a charge movement resistance of the fuel cell catalyst, and may be changed according to a state of the catalyst. The resistor ($Z_w$) may denote gas diffusion resistance of the fuel cell, and may be changed according to the supply state of a reactant.

Figure 7:
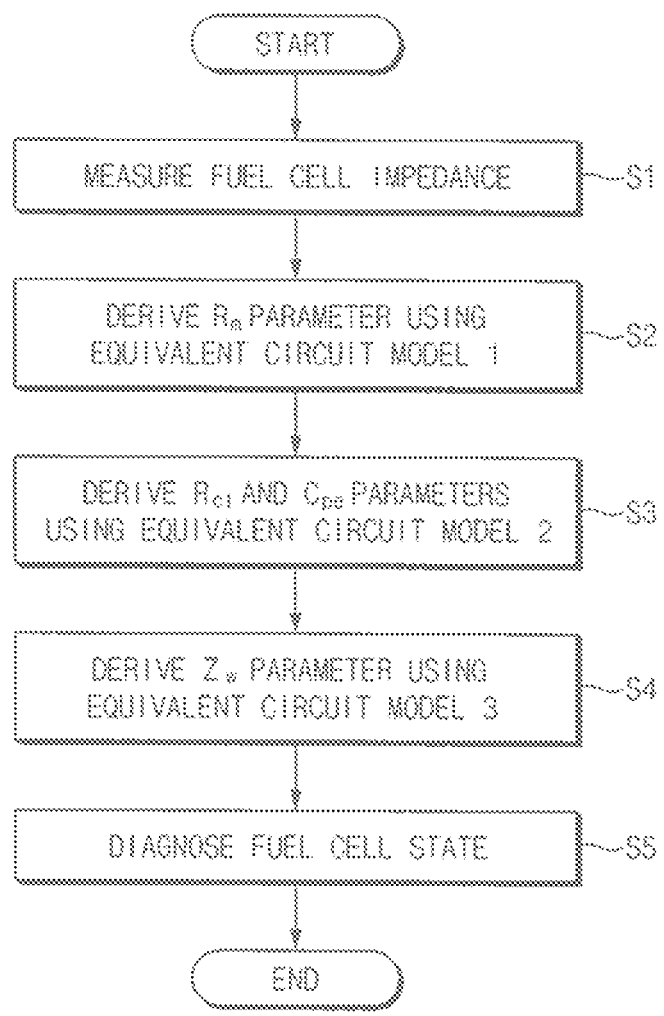
FIG. 7 is a flowchart illustrating a fuel cell diagnosis method according to an embodiment of the present invention.

FIG. 7 is a flowchart illustrating a fuel cell diagnosis method according to an embodiment of the present invention.

Referring to FIG. 7, a user may input a signal for diagnosing the fuel cell state. The impedance measurement unit 100 may measure impedance of the fuel cell within a specific frequency range in step S1. In this case, the impedance measurement unit 100 may measure impedance at a frequency range of 0.1~1 kHz.

The equivalent circuit model unit 200 may select a first equivalent circuit model (1) shown in FIG. 4, and may derive the parameter value for the ohmic resistor (Rm) in step S2. In this case, the equivalent circuit model unit 200 may select a first frequency range (e.g., 200~1 kHz) in which the corresponding parameter greatly affects the impedance of the equivalent circuit.

In addition, the remaining parts other than parameters selected when the parameter value of the ohmic resistor ($R_m$) is derived may be simplified. That is, although the fuel cell equivalent circuit model is equal to that of FIG. 6, the simplified model shown in FIG. 4 may be used to derive the parameter value of the ohmic resistor ($R_m$).

Thereafter, the parameter value for the selected ohmic resistor ($R_m$) is derived by CNLS execution. The derived parameter value for the ohmic resistor ($R_m$) is fixed to a constant.

Thereafter, the equivalent circuit model unit 200 may select a second equivalent circuit model (2) shown in FIG. 5, and may derive parameter values for the active resistor ($R_{ct}$) and the capacitor ($C_{PE}$) in step S3. In this case, the equivalent circuit model unit 200 may select a second frequency range (e.g., 20~200 Hz) in which the corresponding parameter greatly affects the impedance of the equivalent circuit.

In addition, the remaining parts other than parameters selected when the parameter values of the active resistor ($R_{ct}$) and the capacitor ($C_{PE}$) are derived may be simplified. That is, although the fuel cell equivalent circuit model is equal to that of FIG. 6, the simplified model shown in FIG. 5 may be used to derive the parameter values of the active resistor ($R_{ct}$) and the capacitor ($C_{PE}$).

Subsequently, the parameter values for the selected active resistor ($R_{ct}$) and capacitor ($C_{PE}$) are derived by CNLS execution. The derived parameter value for the ohmic resistor ($R_m$) is fixed to a constant. In addition, the derived parameter values for the active resistor ($R_{ct}$) and the capacitor ($C_{PE}$) are fixed to a constant.

Subsequently, the equivalent circuit model unit 200 may derive parameter values of the resistor ($Z_w$) by selecting a third equivalent circuit model (3) shown in FIG. 6 in step S4. In this case, the equivalent circuit model unit 200 may select a third frequency range (e.g., 0.1~20 Hz) in which the corresponding parameter greatly affects the impedance of the equivalent circuit. The first, second, and third frequency ranges, except a lower limit of the first frequency range, upper and lower limits of the second frequency range, and an upper limit of the third frequency range, may not overlap with each other. A frequency range covered by the first, second, and third frequency ranges may be equal to or within the frequency range used by the impedance measurement unit 100 to determine the impedance.

Subsequently, the parameter value for the selected ohmic resistor ($R_m$) is derived by CNLS execution. The derived parameter value for the ohmic resistor ($R_m$) is fixed to a constant.

Thereafter, the fuel-cell-state diagnosis unit 300 may diagnose the state of the fuel cell on the basis of the parameter value derived from the equivalent circuit model unit 200 in step S5.

The parameters derived from the equivalent circuit model unit 200 may be analyzed as follows.

$R_m$ is an ohmic resistance component of the fuel cell, and is changed with the internal moisture of the fuel cell. $R_{ct}$ is a charge movement resistance component of the fuel cell, and is changed according to the fuel-cell catalytic area and the presence or absence of impurities in the fuel cell.

In addition, $C_{PE}$ and $C_{dl}$ may denote interfacial characteristics between the fuel cell membrane and the catalyst, and may be changed according to the fuel cell catalytic area and the internal moisture of the fuel cell. $Z_w$ may denote gas diffusion resistance of the fuel cell, and may be changed according to whether reaction gas is smoothly supplied to the fuel cell.

The fuel-cell-state diagnosis unit 300 may diagnose the state of the fuel cell on the basis of the above-mentioned parameter values, as represented by the following Table 1.

TABLE 1

| Case No. | Rm | Rct | CPE(Cdl) | Zw | Fuel cell state |
|---|---|---|---|---|---|
| Case 1 | normal | normal | normal | normal | normal |
| Case 2 | high | normal | Don't care | Don't care | Insufficient moisture |
| Case 3 | normal or low | high | High | Don't care | Excessive moisture |
| Case 4 | high | high | Don't care | high | Impurity implantation |
| Case 5 | normal | high | Low | Don't care | Catalyst deterioration |

For example, if all parameter values are considered normal, the fuel-cell-state diagnosis unit 300 determines that the fuel cell is in a normal state. If the parameter value of the ohmic resistor ($R_m$) is high, the fuel-cell-state diagnosis unit 300 determines that the fuel cell has insufficient moisture.

If the active resistor ($R_{ct}$) and the capacitors ($C_{PE}$, $C_{dl}$) have a high parameter value, the fuel-cell-state diagnosis unit 300 determines that the fuel cell has excess moisture. If the ohmic resistor ($R_m$), the active resistor ($R_{ct}$), and the resistor ($Z_w$) have a high parameter value, the fuel-cell-state diagnosis unit 300 determines that impurities are implanted into the fuel cell. In addition, if the active resistor (Rct) has a high resistance value and the capacitors ($C_{PE}$, $C_{dl}$) have a low parameter value, the fuel-cell-state diagnosis unit 300 determines that the fuel cell state is a catalyst deterioration state.

As described above, the method for allowing the equivalent circuit model unit 200 to derive the parameter value according to the embodiment can be represented by the following equation 2.

$$Z(f) = R_m + \frac{R_{ct} + Z_w}{1 + j \cdot 2\pi \cdot f \cdot (R_{ct} + Z_w) \cdot C_{dl}} \quad \text{[Equation 2]}$$

The equivalent circuit model unit 200 according to the embodiment can improve robustness against the fuel-cell impedance measurement noise. That is, according to the conventional art, impedance is measured at a specific frequency (e.g., 300 Hz) and the amount of moisture contained in the fuel cell is recognized, so that the internal state of the fuel cell is absolutely determined by impedance of 30 Hz frequency.

However, the present invention may estimate parameters of the fuel cell equivalent circuit on the basis of impedance values of all the measured frequency ranges. Therefore, the present invention can more accurately recognize the internal state of the fuel cell when recognizing the internal moisture through only one measurement.

In addition, the present invention can improve throughput needed for deriving the fuel cell equivalent circuit parameter. That is, according to the conventional art, while the fuel cell equivalent circuit is derived, only one fixed fuel cell equivalent circuit model is generally used using data of all the acquired frequency ranges.

In contrast, the embodiment of the present invention is characterized in that respective fuel cell equivalent circuit parameters differently affect the overall impedance according to the frequency range. That is, when each parameter is derived, an optimum frequency range (in which parameters to be derived can greatly affect the overall impedance) is selected and other parameters except for the derived parameter are simplified, resulting in reduction of the number of calculation times. In addition, one parameter having been derived once is fixed to a constant, so that the number of calculations can be reduced.

As is apparent from the above description, the present invention can increase the accuracy for deriving equivalent circuit parameters of the fuel cell, and reduce the number of calculations needed for deriving the fuel-cell equivalent circuit parameters, resulting in reduction of production costs and power consumption.

The above-mentioned embodiments are merely exemplary for better understanding of the present invention, and the scope of the present invention is not limited thereto. For example, a single component may be divided into two or more components, or two or more components may be combined into a single component as needed.

What is claimed is:

1. An apparatus for diagnosing a fuel cell, comprising:
   an impedance measurement unit configured to measure impedance of a fuel cell within a predetermined frequency range;
   an equivalent circuit model unit configured to derive a parameter value by estimating a predetermined fuel-cell equivalent circuit model in response to the impedance received from the impedance measurement unit; and
   a fuel-cell-state diagnosis unit configured to diagnose a state of the fuel cell by detecting variation of the parameter value derived from the equivalent circuit model unit,
   wherein the equivalent circuit model unit derives at least one of parameters of a first ohmic resistor, a second active resistor, a capacitor, and a third resistor, and
   the equivalent circuit model unit derives parameter values of the second active resistor and the capacitor using a second equivalent circuit model within a second frequency range.

2. The apparatus according to claim 1, wherein the equivalent circuit model unit derives the parameter of the fuel cell equivalent circuit model using Complex Non-linear Least Squares (CNLS).

3. The apparatus according to claim 1, wherein the equivalent circuit model unit derives a parameter value of the first ohmic resistor using a first equivalent circuit model within a first frequency range.

4. The apparatus according to claim 1, wherein the parameter value of the first ohmic resistor is fixed to a constant.

5. The apparatus according to claim 1, wherein the equivalent circuit model unit derives a parameter value of the third resistor using a third equivalent circuit model within a third frequency range.

6. The apparatus according to claim 5, wherein each of the parameter values of the first ohmic resistor, the second active resistor, and the capacitor is fixed to a constant.

7. The apparatus according to claim 1, wherein the equivalent circuit model unit changes measurement data of the predetermined frequency range and the fuel cell equivalent circuit model according to categories of the parameters.

8. The apparatus according to claim 1, wherein the equivalent circuit model unit allows other parameters other than a selected parameter to select a simplified model and use the selected model.

9. The apparatus according to claim 1, wherein the fuel-cell-state diagnosis unit determines at least one state of the amount of internal moisture contained in the fuel cell, a catalyst area and presence or absence of impurities, and a supply state of reaction gas for the fuel cell.

10. A method for diagnosing a fuel cell, comprising:
    measuring impedance of a fuel cell within a predetermined frequency range;
    deriving a parameter value by estimating a predetermined fuel-cell equivalent circuit model in response to the measured impedance; and diagnosing a state of the fuel cell by detecting variation of the derived parameter value, wherein the derivation of the parameter value includes:

deriving a parameter value of an ohmic resistor using a first equivalent circuit model within a first frequency range;

deriving parameter values of an active resistor and a capacitor using a second equivalent circuit model within a second frequency range;

fixing a parameter value of the ohmic resistor to a constant;

deriving a parameter value of a third resistor using a third equivalent circuit model within a third frequency range; and fixing each of the parameter values of the ohmic resistor, the active resistor, and the capacitor to a constant.

11. The method according to claim 10, further comprising:

deriving the parameter of the fuel cell equivalent circuit model using Complex Non-linear Least Squares (CNLS).

12. The method according to claim 10, further comprising:

changing measurement data of the predetermined frequency range and the fuel cell equivalent circuit model according to categories of the parameters.

* * * * *